United States Patent
Sanders et al.

(10) Patent No.: US 11,420,816 B2
(45) Date of Patent: Aug. 23, 2022

(54) AIR RESERVOIR ASSEMBLY FOR A SUBMERGIBLE ENCLOSURE

(71) Applicant: Donaldson Company, Inc., Minneapolis, MN (US)

(72) Inventors: Jacob L. Sanders, Apple Valley, MN (US); Robert O. Nelson, Eagan, MN (US); James P. Moorman, Eden Prairie, MN (US); Daniel J. Dotzler, Webster, MN (US)

(73) Assignee: Donaldson Company, Inc., Bloomington, MN (US)

( * ) Notice: Subject to any disclaimer, the term of this patent is extended or adjusted under 35 U.S.C. 154(b) by 126 days.

(21) Appl. No.: 16/826,639

(22) Filed: Mar. 23, 2020

(65) Prior Publication Data

US 2020/0307906 A1 Oct. 1, 2020

Related U.S. Application Data

(60) Provisional application No. 62/823,476, filed on Mar. 25, 2019.

(51) Int. Cl.
*B65D 90/32* (2006.01)

(52) U.S. Cl.
CPC .................................... *B65D 90/32* (2013.01)

(58) Field of Classification Search
CPC ............ B65D 2585/86; B65D 2205/02; B65D 15/22; B65D 15/02; B65D 11/18; B65D 11/10; B65D 11/02; B65D 9/04; B65D 90/32; H05K 5/068; H05K 5/0213; H02G 3/08
See application file for complete search history.

(56) References Cited

U.S. PATENT DOCUMENTS

| | | | | |
|---|---|---|---|---|
| 2,278,991 A | * | 4/1942 | Hasslacher | A01G 27/00 47/79 |
| 2,948,432 A | * | 8/1960 | Bodley | B65D 90/32 220/722 |
| 4,465,189 A | | 8/1984 | Molzan | |
| 4,491,988 A | * | 1/1985 | Mizuno | E03D 9/037 4/227.3 |
| 4,753,070 A | * | 6/1988 | Werner | F03B 17/00 60/325 |
| 4,766,925 A | * | 8/1988 | Frantz | F01P 11/20 123/41.5 |
| 4,937,972 A | * | 7/1990 | Freitus | A01G 27/003 47/62 R |
| 5,904,272 A | * | 5/1999 | Kaufman | A47K 5/1202 222/207 |
| 6,008,454 A | | 12/1999 | Kawakita | |
| 6,135,307 A | * | 10/2000 | Fahy | A47G 19/02 220/521 |
| 6,709,493 B2 | | 3/2004 | Deguiseppi et al. | |
| 7,217,314 B2 | | 5/2007 | Deguiseppi et al. | |

(Continued)

FOREIGN PATENT DOCUMENTS

| | | |
|---|---|---|
| JP | H07147106 A | 6/1995 |
| WO | 2006/120707 A1 | 11/2006 |

*Primary Examiner* — Kareen K Thomas
(74) *Attorney, Agent, or Firm* — Mueting Raasch Group

(57) ABSTRACT

The present technology relates to an air reservoir for an enclosure where, upon submersion in water, the pressure differential between the water and the enclosure displaces air from the air reservoir into the enclosure to reduce the pressure differential.

20 Claims, 11 Drawing Sheets

(56) References Cited

U.S. PATENT DOCUMENTS

| | | |
|---|---|---|
| 7,570,492 B2 | 8/2009 | Gall et al. |
| 9,667,297 B1 | 5/2017 | Miehl et al. |
| 9,861,000 B2 | 1/2018 | Ishii et al. |
| 2002/0090506 A1 | 7/2002 | Protzner et al. |
| 2006/0113236 A1 | 6/2006 | Dahlgren et al. |
| 2009/0002941 A1 | 1/2009 | Mongia et al. |
| 2010/0227544 A1 | 9/2010 | Furuyama et al. |
| 2012/0255950 A1* | 10/2012 | Russell .................. B05B 1/323 220/202 |
| 2014/0160680 A1 | 6/2014 | Stevens |
| 2017/0045196 A1 | 2/2017 | Yano |
| 2019/0345854 A1* | 11/2019 | Gaikwad ................ B01D 53/30 |

* cited by examiner

AIR RESERVOIR ASSEMBLY FOR A SUBMERGIBLE ENCLOSURE

The present application claims priority to U.S. Provisional Application No. 62/823,476, filed on Mar. 25, 2019, which is incorporated by reference herein.

TECHNOLOGICAL FIELD

The present disclosure is generally related to a submergible enclosure. More particularly, the present disclosure is related to an air reservoir for a submergible enclosure.

BACKGROUND

Some enclosures containing electronic and/or mechanical systems are vented to allow air exchange between the enclosure and the ambient environment. Some such enclosures are submergible under water for at least brief periods of time, and so the enclosure is designed to be waterproof to protect the enclosed system. In some designs, the vent is covered with a waterproof, breathable membrane such as polytetrafluoroethylene (PTFE). In some designs, the vent is coupled to a snorkel (that may or may not be obstructed with PTFE) that extends vertically upward beyond the expected maximum submersion depth. Both of these approaches result in a pressure differential upon submersion of the enclosure, where the water surrounding the enclosure is at a first pressure, and the enclosure volume is at a second pressure that is typically much lower than the water pressure (such as ambient pressure). Further contributing to the differential pressure is the fact that the water surrounding the enclosure is typically at a notably lower temperature than the initial, unsubmerged temperature of the enclosure, which is generally at ambient temperature or warmer. After the enclosure is submerged, the temperature of the enclosure, its components, and the gas therein lowers to the temperature of the water, which further lowers the pressure in the enclosure. This pressure differential causes stress on the components forming the enclosure.

SUMMARY

The present technology relates to an air reservoir for an enclosure where, upon submersion in water, the pressure differential between the water and the enclosure displaces air from the air reservoir into the enclosure to reduce the pressure differential.

In some embodiments, the technology herein relates to a reservoir assembly. The reservoir assembly has a reservoir body defining a first opening and a reservoir volume. The first opening defines a liquid communication path between the reservoir volume and an ambient environment. A water-obstructing breathable structure is disposed across a second opening defined between the reservoir body and an electronic enclosure having an enclosure volume. The reservoir volume extends in a vertical direction between the first opening and the water-obstructing breathable structure. The reservoir body is airtight above the first opening except through the second opening.

In some such embodiments the reservoir body extends vertically above the second opening. Additionally or alternatively, a portion of the reservoir body is oriented obliquely to the vertical direction. Additionally or alternatively, the reservoir body tapers to the first opening. Additionally or alternatively, the assembly has a protective cap disposed in the first opening, where the protective cap and the reservoir body defines a liquid flow pathway through the first opening. Additionally or alternatively, the reservoir body defines the second opening. Additionally or alternatively, the reservoir volume is configured to be at least 0.25 of a fixed system volume comprising the enclosure volume. Additionally or alternatively, the reservoir volume is configured to be at least 0.5 of a fixed system volume comprising the enclosure volume. Additionally or alternatively, the reservoir volume configured to be at least 0.75 of a fixed system volume comprising the enclosure volume.

Additionally or alternatively, the water-obstructing breathable structure has a membrane. Additionally or alternatively, the water-obstructing breathable structure has a one-way valve. Additionally or alternatively, the water-obstructing breathable structure has an electronically-actuated valve. Additionally or alternatively, the water-obstructing breathable structure has a hydrophobic fabric.

Additionally or alternatively, the reservoir body further defines a coupling structure configured to be coupled to the electronic enclosure to define an airflow pathway through the second opening. Additionally or alternatively, the coupling structure is defined towards a top of the reservoir body. Additionally or alternatively, the coupling structure is defined towards a bottom of the reservoir body. Additionally or alternatively, the coupling structure is defined between a top and a bottom of the reservoir body.

In some embodiments, the technology relates to a reservoir assembly having a reservoir body defining a first opening, a second opening, a coupling structure, and a reservoir volume extending in a vertical direction between the first opening and the second opening. The first opening defines a liquid communication path between the reservoir volume and an ambient environment. The coupling structure is configured to be coupled to an electronic enclosure to define an airflow pathway between the reservoir volume and an enclosure volume of the electronic enclosure through the second opening. A water-obstructing breathable structure is disposed across the second opening.

In some such embodiments, the coupling structure is defined towards a top of the reservoir body. Additionally or alternatively, the coupling structure is defined towards a bottom of the reservoir body. Additionally or alternatively, the coupling structure is defined between a top and a bottom of the reservoir body. Additionally or alternatively, the reservoir body is airtight above the first opening except through the second opening. Additionally or alternatively, the reservoir body extends vertically above the second opening. Additionally or alternatively, a portion of the reservoir body is oriented obliquely to the vertical direction. Additionally or alternatively, the reservoir body tapers to the first opening. Additionally or alternatively, a protective cap is disposed in the first opening, where the protective cap and the reservoir body defines a liquid flow pathway through the first opening.

Additionally or alternatively, the reservoir volume is configured to be at least 0.25 of a fixed system volume comprising the enclosure volume. Additionally or alternatively, the reservoir volume is configured to be at least 0.50 of a fixed system volume comprising the enclosure volume. Additionally or alternatively, the reservoir volume is configured to be at least 0.75 of a fixed system volume comprising the enclosure volume. Additionally or alternatively, the water-obstructing breathable structure has a membrane. Additionally or alternatively, the water-obstructing breathable structure has a one-way valve. Additionally or alternatively, the water-obstructing breathable structure has an electronically-actuated valve. Additionally or alternatively, the water-obstructing breathable structure has a hydrophobic fabric.

Some embodiments relate to a submergible enclosure system having an enclosure housing defining an enclosure volume and a reservoir body. The reservoir body defines a first opening and a reservoir volume, where the first opening defines a liquid communication path between the reservoir volume and an ambient environment. The enclosure system defines a second opening defining an airflow pathway between the enclosure volume and the reservoir volume. The reservoir volume extends in a vertical direction between the first opening and the second opening. A water-obstructing breathable structure is disposed across the second opening, and the enclosure housing is waterproof.

In some such embodiments, the reservoir body is airtight above the first opening except through the second opening. Additionally or alternatively, the reservoir body defines the second opening. Additionally or alternatively, the enclosure housing defines the second opening. Additionally or alternatively, the second opening is mutually defined by the enclosure volume and the reservoir body. Additionally or alternatively, a portion of the reservoir body is oriented obliquely to the vertical direction. Additionally or alternatively, the reservoir body tapers to the first opening. Additionally or alternatively, the system has a protective cap disposed in the first opening, where the protective cap and the reservoir body defines a liquid flow pathway through the first opening.

Additionally or alternatively, the reservoir volume is configured to be at least 0.25 of a fixed system volume comprising the enclosure volume. Additionally or alternatively, the reservoir volume is configured to be at least 0.5 of a fixed system volume comprising the enclosure volume. Additionally or alternatively, the reservoir volume is configured to be at least 0.75 of a fixed system volume comprising the enclosure volume. Additionally or alternatively, the reservoir body further defines a coupling structure configured to be coupled to the enclosure housing about the airflow pathway. Additionally or alternatively, the coupling structure is defined towards a top of the reservoir body. Additionally or alternatively, the coupling structure is defined towards a bottom of the reservoir body. Additionally or alternatively, the coupling structure is defined between a top and a bottom of the reservoir body.

Additionally or alternatively, the reservoir body extends vertically above the second opening. Additionally or alternatively, the water-obstructing breathable structure has a membrane. Additionally or alternatively, the water-obstructing breathable structure has a one-way valve. Additionally or alternatively, the water-obstructing breathable structure has an electronically-actuated valve. Additionally or alternatively, the water-obstructing breathable structure has a hydrophobic fabric.

In some embodiments, the technology is related to a submergible enclosure system having an enclosure housing having a substantially fixed enclosure volume. The enclosure housing defines an enclosure opening, and the enclosure housing is waterproof. A reservoir body has a variable reservoir volume responsive to external pressure, where the reservoir body is waterproof. The reservoir body defines a reservoir opening in airtight communication with the enclosure opening.

In some such embodiments, the reservoir body defines a first reservoir volume at atmospheric pressure and a smaller, a second reservoir volume when the reservoir body is submerged under water. Additionally or alternatively, the reservoir body has bellows. Additionally or alternatively, the reservoir body has a bladder. Additionally or alternatively, the bladder is an elastomeric material. Additionally or alternatively, the reservoir body has a piston pathway and a piston slidably disposed in the opening. Additionally or alternatively, the water-obstructing breathable structure has a membrane. Additionally or alternatively, the water-obstructing breathable structure has a one-way valve. Additionally or alternatively, the water-obstructing breathable structure has an electronically-actuated valve. Additionally or alternatively, the water-obstructing breathable structure has a hydrophobic fabric.

Additionally or alternatively, the reservoir volume is configured to be at least 0.25 of a fixed system volume comprising the enclosure volume. Additionally or alternatively, the reservoir volume is configured to be at least 0.50 of a fixed system volume comprising the enclosure volume. Additionally or alternatively, the reservoir volume is configured to be at least 0.75 of a fixed system volume comprising the enclosure volume. Additionally or alternatively, the reservoir body has a water-obstructing breathable structure at least partially defining the reservoir body. Additionally or alternatively, the reservoir body has a water-obstructing breathable structure at least partially defining a bottom surface of the reservoir body Some embodiments relate to a reservoir having a reservoir body defining a reservoir opening and a variable reservoir volume responsive to external pressure. The reservoir body is waterproof except through the reservoir opening, and the reservoir body has a water-obstructing breathable structure at least partially defining the bottom of the reservoir body. A coupling structure is configured to be coupled to an enclosure housing to define an airflow pathway through the reservoir opening.

Additionally or alternatively, the reservoir body has bellows. Additionally or alternatively, the reservoir body has a bladder. Additionally or alternatively, the bladder is an elastomeric material. Additionally or alternatively, the reservoir body has a vertically-extending opening and a piston slidably disposed in the opening. Additionally or alternatively, the water-obstructing breathable structure has a membrane. Additionally or alternatively, the water-obstructing breathable structure has a one-way valve. Additionally or alternatively, the water-obstructing breathable structure has an electronically-actuated valve. Additionally or alternatively, the water-obstructing breathable structure has a hydrophobic fabric. Additionally or alternatively, the reservoir volume is configured to be at least 0.25 of a fixed system volume comprising the enclosure volume. Additionally or alternatively, the reservoir volume is configured to be at least 0.50 of a fixed system volume comprising the enclosure volume. Additionally or alternatively, the reservoir volume is configured to be at least 0.75 of a fixed system volume comprising the enclosure volume.

For purposes of calculating the ratio between the reservoir volume and the fixed system volume, the reservoir volume is the variable volume of the system and the enclosure volume is at least a portion of the fixed system volume contained within the system between the reservoir and the enclosure. In particular, the reservoir volume is the maximum reservoir volume (when the reservoir is under atmospheric conditions) minus the minimum reservoir volume (when the reservoir is compressed under an expected maximum water pressure). The fixed system volume is the enclosure volume plus the minimum reservoir volume and any volume between the reservoir and the enclosure. The enclosure volume is the total volume of the enclosure minus the volume consumed by solid and liquid components in the enclosure volume including the reservoir volume (only if the reservoir volume is configured to be contained by the enclosure volume).

The above summary is not intended to describe each embodiment or every implementation. Rather, a more complete understanding of illustrative embodiments will become apparent and appreciated by reference to the following Detailed Description of Exemplary Embodiments and claims in view of the accompanying figures of the drawing.

BRIEF DESCRIPTION OF THE DRAWINGS

The present technology may be more completely understood and appreciated in consideration of the following detailed description of various embodiments in connection with the accompanying drawings.

Figure 1:
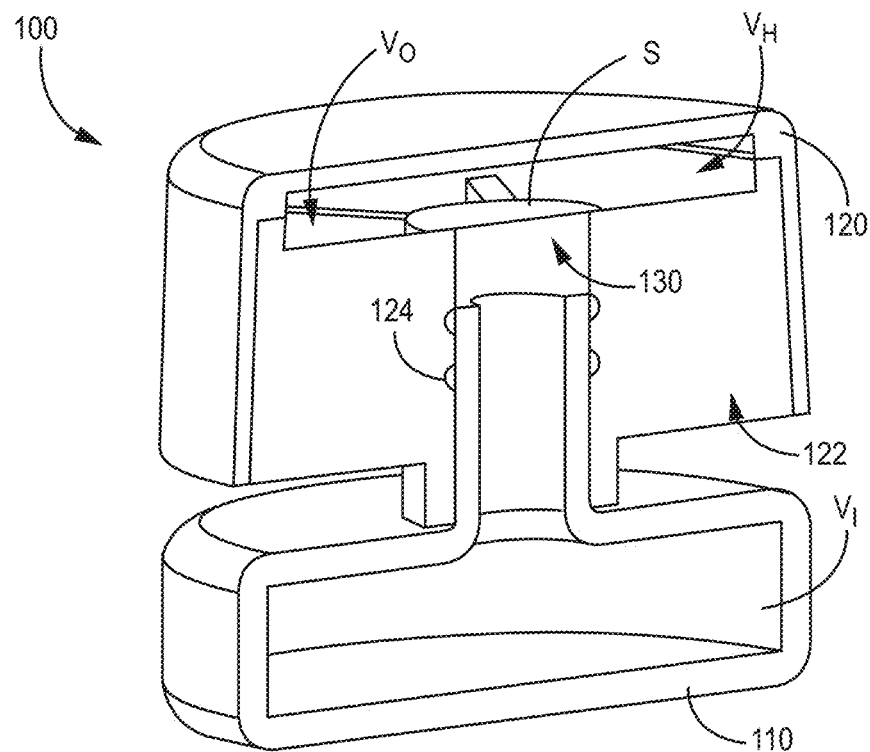
FIGS. 1-13, 15, 17 and 19-21 depict various submergible enclosure systems consistent with the technology disclosed herein.

The figures are rendered primarily for clarity and, as a result, are not necessarily drawn to scale. Moreover, various structure/components, including but not limited to fasteners, electrical components (wiring, cables, etc.), and the like, may be shown diagrammatically or removed from some or all of the views to better illustrate aspects of the depicted embodiments, or where inclusion of such structure/components is not necessary to an understanding of the various exemplary embodiments described herein. The lack of illustration/description of such structure/components in a particular figure is, however, not to be interpreted as limiting the scope of the various embodiments in any way.

DETAILED DESCRIPTION

The present technology relates to an air reservoir for an enclosure where, upon submersion in water, the pressure differential between the water and the enclosure displaces air from the air reservoir into the enclosure to reduce the pressure differential. In some scenarios, the pressure differential is exacerbated by a temperature difference between the water and the initial temperature of the enclosure (which can be at the ambient temperature or higher). After the enclosure is submerged under water, it decreases in temperature, which lowers the pressure of the gas in the volume of the enclosure.

FIGS. 1-13, 15, and 17 each depict an enclosure system 100 consistent with some embodiments of the technology disclosed herein, and components having the same name reflect the same element number herein. The enclosure system 100 generally has an enclosure housing 110 and a reservoir body 120. The enclosure housing 110 defines an enclosure volume $V_I$ and the reservoir body 120 defines a reservoir volume $V_O$.

The reservoir body 120 defines a first opening 122 that defines a liquid communication path between the reservoir volume $V_O$ and an ambient environment outside of the system 100. The enclosure system 100 generally defines a second opening 130 that defines an airflow pathway between the enclosure volume $V_I$ and the reservoir volume $V_O$. In some embodiments, such as those consistent with FIGS. 1-6, 8, 9, 11-13, 15, and 17, the second opening 130 can be defined by the reservoir body 120. In some embodiments, such as those consistent with FIGS. 1-3, 6-13, 15 and 17, the second opening 130 can be defined by the enclosure housing 110. In some such embodiments the second opening 130 can be mutually defined by the enclosure housing 110 and the reservoir body 120.

The enclosure housing 110 is generally constructed to be waterproof such that the enclosure housing 110 can be submerged to a particular depth without intrusion of water into the enclosure volume $V_I$. As such, a water-obstructing breathable structure S is disposed across the second opening 130. The water-obstructing breathable structure S prevents liquid water from entering the enclosure volume $V_I$ from the reservoir volume $V_O$ but allows air to move from the reservoir volume $V_O$ to the enclosure volume $V_I$.

The water-obstructing breathable structure S can be various types of components. In some embodiments, the water-obstructing breathable structure S is a hydrophobic fabric. In some embodiments, the water-obstructing breathable structure S is a waterproof, breathable membrane, such as PTFE or another type of membrane. Where the water-obstructing breathable structure S is a fabric or membrane, the water-obstructing breathable structure S can be oriented vertically in the system 100 (such as in FIG. 6), or obliquely to the horizontal plane (such as in FIG. 9), to prevent fouling of the material by allowing water and debris to fall away from the material under the force of gravity. In some embodiments the water-obstructing breathable structure S is a mechanically or electrically operated valve. The valve can be a one-way valve, in some such embodiments.

Figure 12:
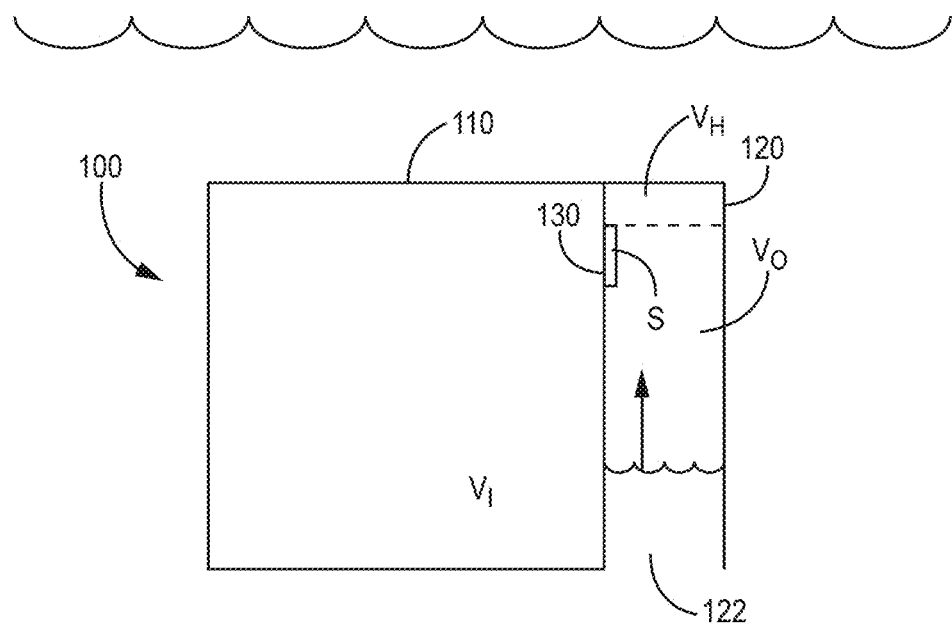
Figure 13:
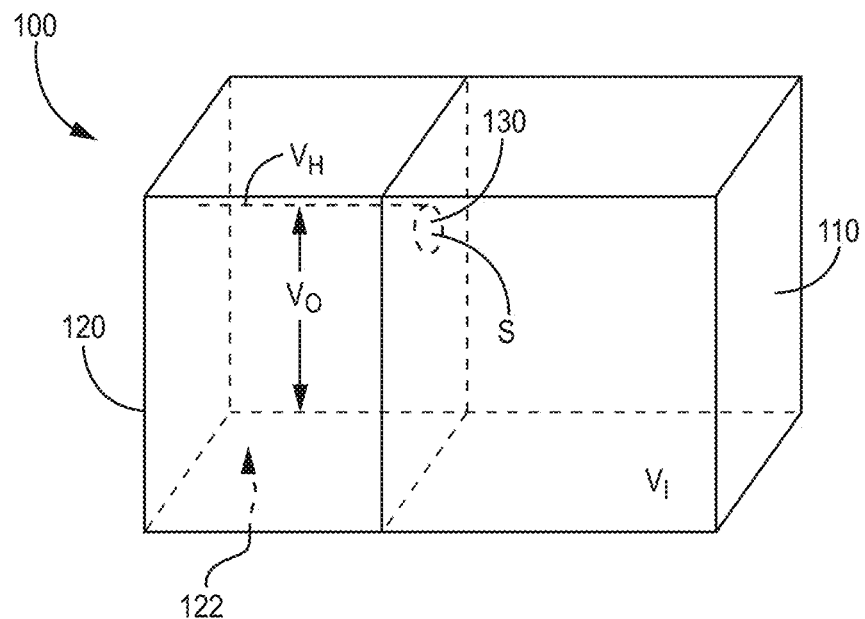

The reservoir body 120 is generally configured to hold a volume of air to be available for transmission to the enclosure volume $V_I$ to equalize pressure when pressure outside the system 100 is comparatively high, such as when the system 100 is submerged under water, such as depicted in FIG. 12. The water enters the reservoir volume $V_O$ and applies pressure vertically upwards against the air in the reservoir volume $V_O$, which displaces the air into the enclosure volume $V_I$ until either (1) the water pressure is no longer greater than the air pressure in the system 100 (equilibrium is reached) or (2) the water level rises above the second opening 130, so air can no longer pass through the second opening 130 to the enclosure volume $V_I$. Since it can take some time for the air temperature in the system 100 to cool to the temperature of the surrounding water (which impacts air pressure in the system), it correspondingly can take some time for the system and the surrounding water to reach equilibrium with respect to differential pressure.

Figure 2:
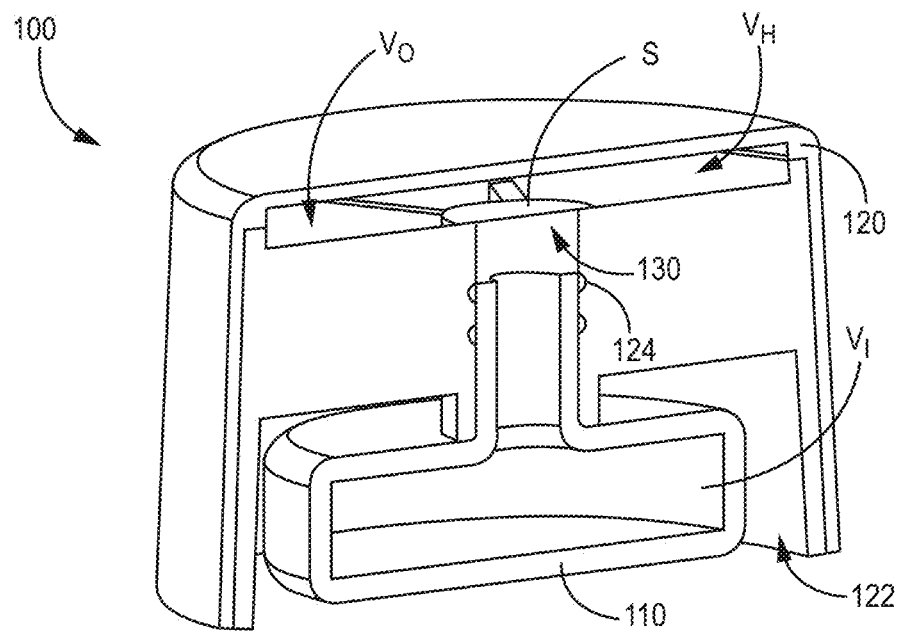
Figure 3:
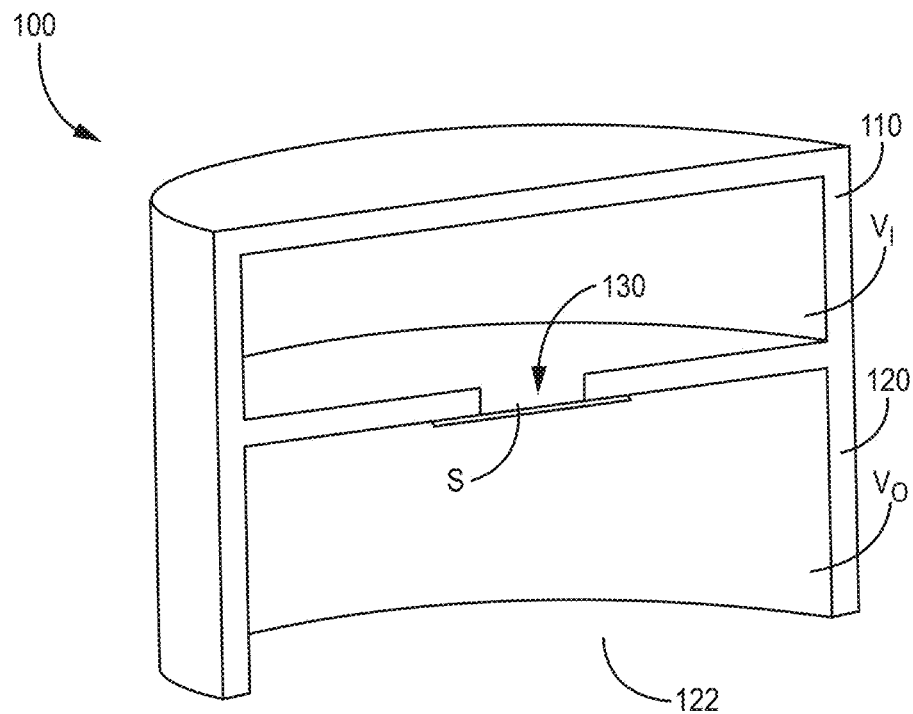
Figure 4:
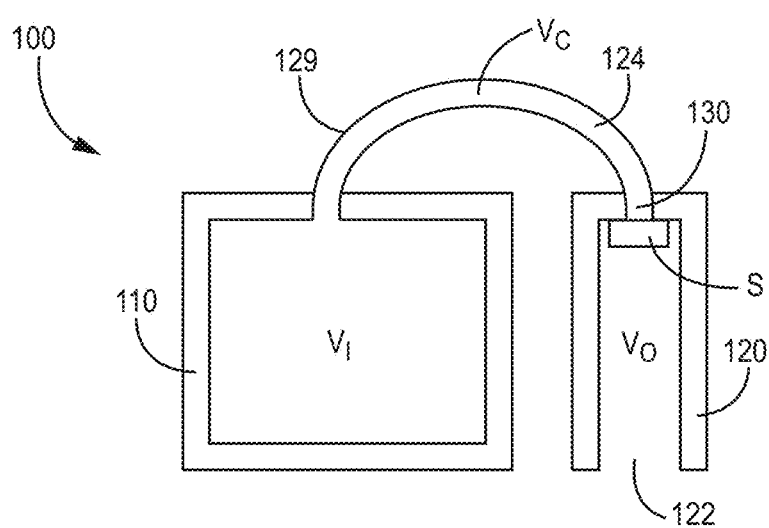
Figure 5:
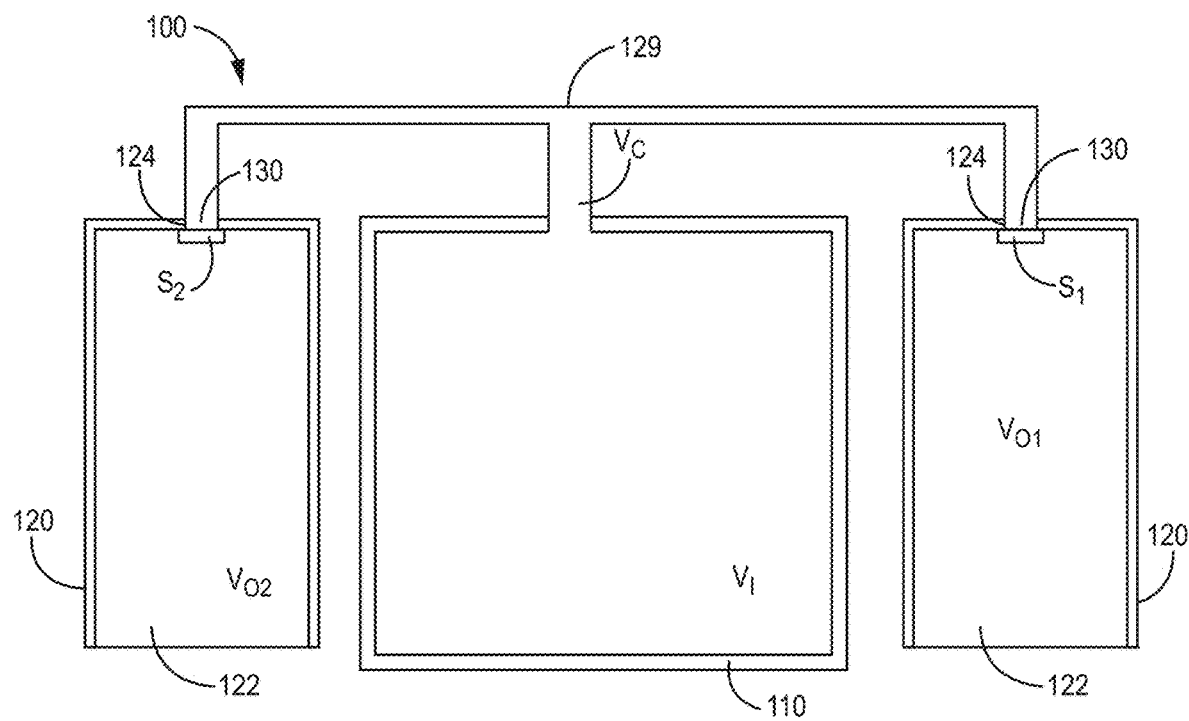
Figure 6:
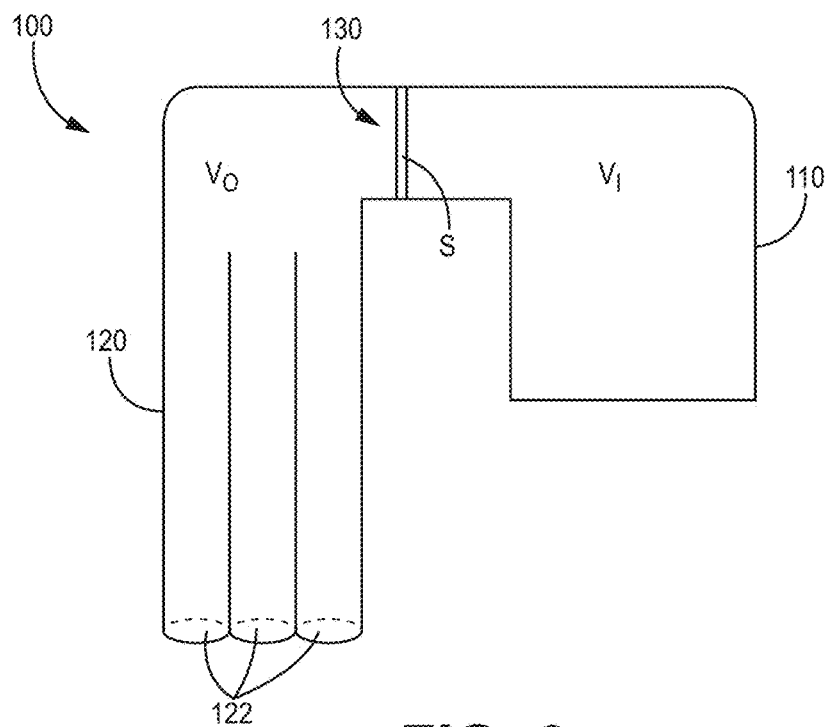
Figure 7:
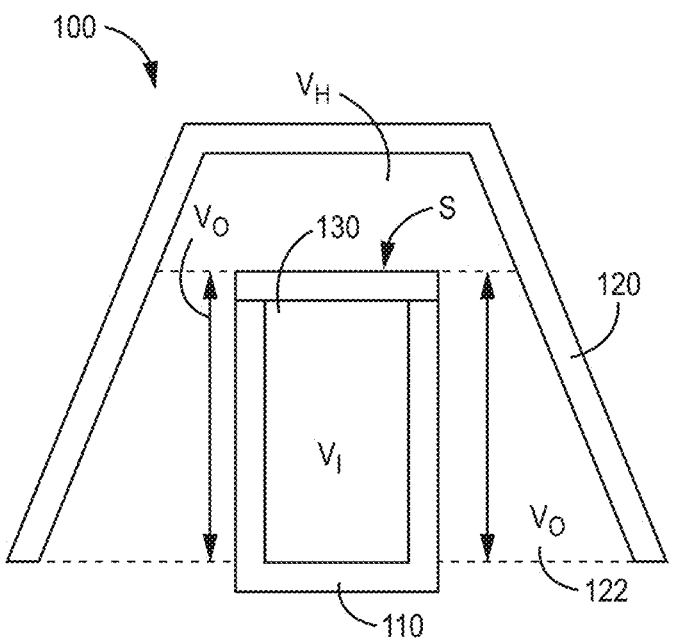
Figure 10:
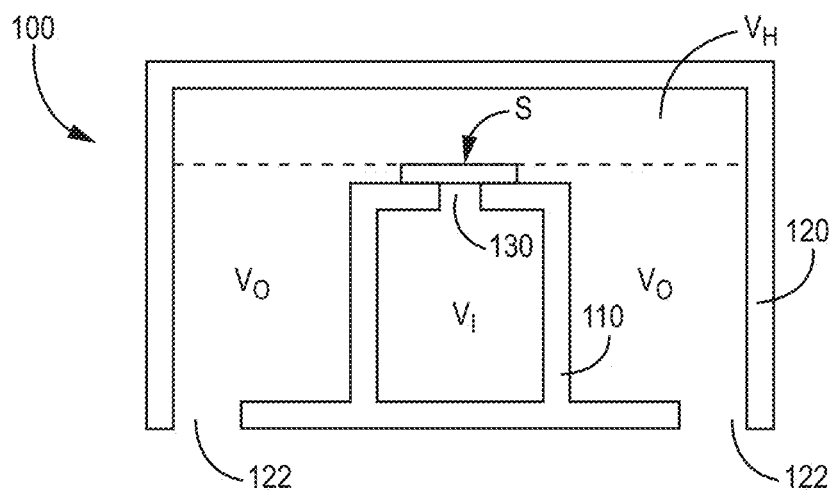
Figure 11:
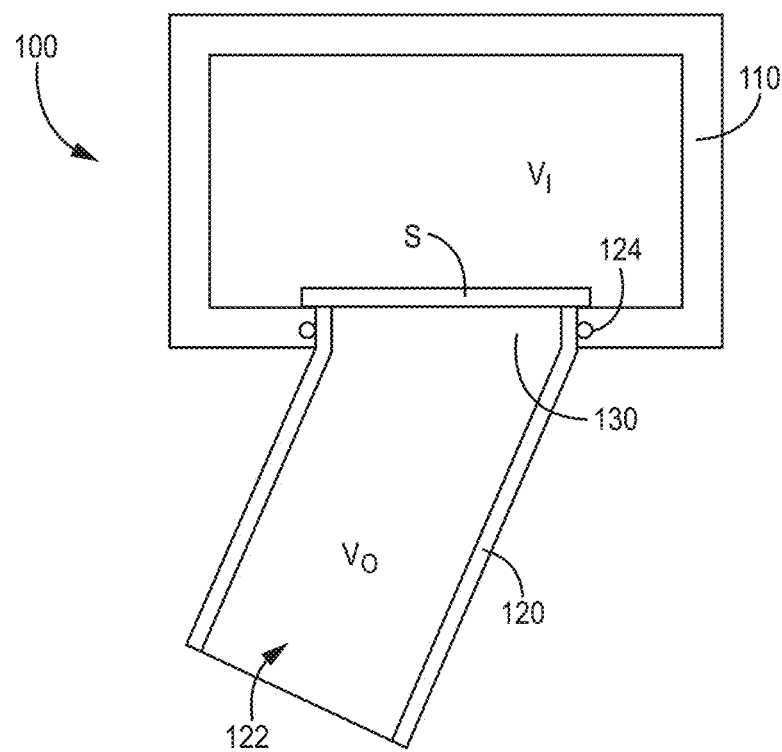
Figure 17:
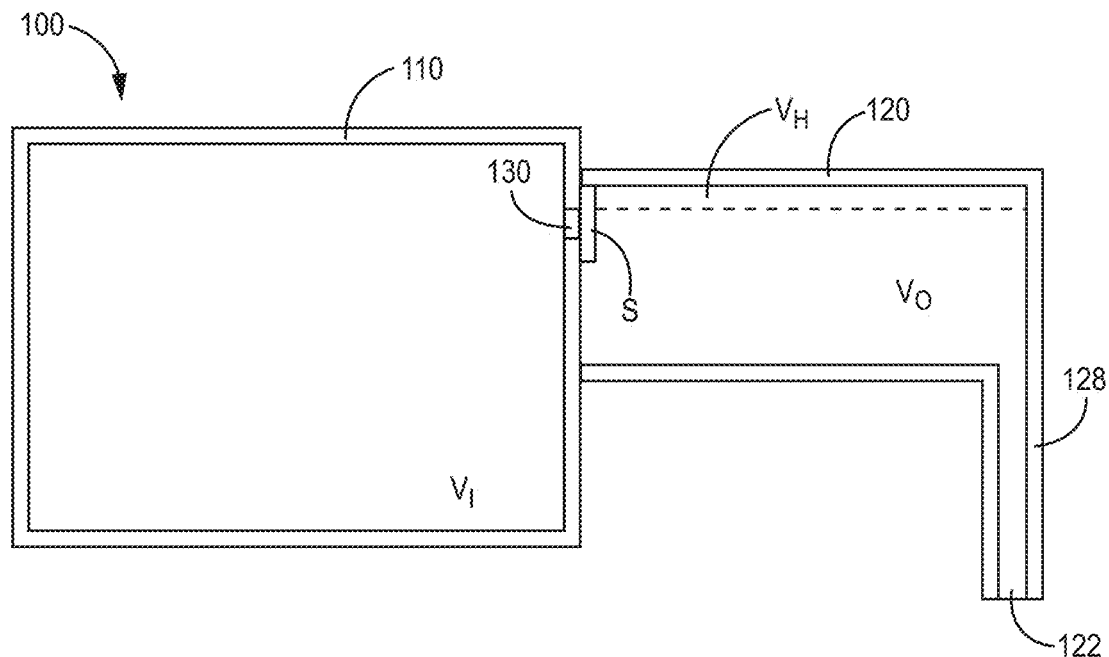

The reservoir volume $V_O$ can have various configurations, which are now briefly described using non-exclusive list of examples from the figures. FIGS. 1 and 2 show a reservoir volume $V_O$ that is at least partially defined by a plurality of radial channels extending from a central second opening 130. FIGS. 2-6 show a reservoir volume $V_O$ that extends from the bottom of the system 100. FIG. 1 shows a reservoir volume that $V_O$ that is above the enclosure volume $V_I$. FIG. 4 depicts a single reservoir volume $V_O$, and FIG. 5 depicts more than one reservoir volume having a total reservoir volume of $V_{O1}+V_{O2}$. FIG. 6 shows a reservoir volume $V_O$ that is formed from multiple channels. In FIGS. 2, 7 and 10, the reservoir volume $V_O$ contains the enclosure housing 120, and in FIG. 8 the enclosure housing 110 contains the reservoir body 120. In FIG. 17, the reservoir body 120 has a relatively narrow tubular structure 128 that defines a portion of the reservoir volume $V_O$.

To prevent air from escaping the reservoir volume $V_O$ when the system is submerged, the reservoir body 120, and therefore the reservoir volume $V_O$, generally extends in a vertical direction between the first opening 122 and the second opening 130. Also, the reservoir body 120 is generally airtight above the first opening 122 except through the second opening 130. The reservoir body 120 need not be oriented perfectly vertical, in some embodiments, the reservoir body 120 is oriented obliquely to the vertical direction, such as in the embodiment depicted in FIG. 11.

The reservoir volume $V_O$ is generally sized to contain a volume of ambient air that, when the system 100 is submerged to a particular maximum water depth (resulting in a maximum pressure) at a particular minimum water temperature (resulting in cooling of the contained air, which reduces the air pressure), would reduce or eliminate the differential pressure between the enclosure 110 and the water when displaced to the enclosure 110. In some embodiments the reservoir volume $V_O$ is configured to be at least 0.25 of the fixed system volume. In some embodiments the reservoir volume $V_O$ is configured to be at least 0.5 of a fixed system volume. In some embodiments the reservoir volume $V_O$ is configured to be at least 0.75 of a fixed system volume. In some embodiments the reservoir volume $V_O$ is configured to be about equal to a fixed system volume, wherein "about equal to" means within 5% of the fixed system volume.

For purposes of calculating the ratio between the reservoir volume $V_O$ and the fixed system volume, the reservoir volume is the variable volume contained within the system and fixed system volume is the fixed volume contained within the system between the reservoir and the enclosure. In particular, the reservoir volume $V_O$ is the maximum reservoir volume (when the reservoir is under atmospheric conditions) minus the minimum reservoir volume (when the reservoir is compressed under an expected maximum water pressure).

The fixed system volume is generally the fixed available airspace within the system 100 that is outside of the reservoir 110. The fixed system volume generally includes the enclosure volume $V_I$ and other fixed volumes in the system 100 between the enclosure 110 and the reservoir 120 such as the minimum reservoir volume and/or headspace, and conduit volume, which will be described in more detail below. The enclosure volume $V_I$ is the actual volume of the enclosure 110 minus the volume consumed by solid and liquid components in the enclosure volume $V_I$ as well as the reservoir volume $V_O$ only if the reservoir volume $V_O$ is contained by the enclosure volume $V_I$ (such as in FIG. 8).

In some embodiments, such as those consistent with FIGS. 1, 2, 7, 9, 10, 12, 13, and 17, the reservoir body 120 extends vertically above the second opening 130 to define a headspace volume $V_H$. The headspace volume $V_H$ can be considered the minimum volume of the reservoir body 120. Since the air in the headspace volume $V_H$ can't be pushed downward through the second opening 130 once the water level rises above the second opening 130, the reservoir volume $V_O$ (which is the variable volume of the system) excludes the headspace volume $V_H$. The headspace $V_H$ is considered part of the fixed volume of the system 100. Furthermore, in some embodiments, such as those consistent with FIGS. 4 and 5, a conduit 129 between the enclosure 110 and the reservoir body 120 (or bodies) can define a fixed conduit volume $V_C$. The conduit volume $V_C$ is also considered part of the fixed system volume.

Figure 14:
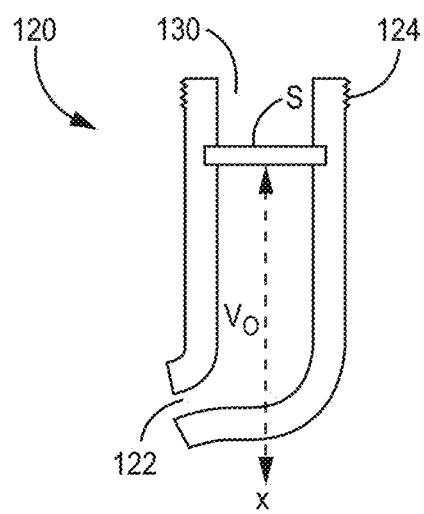
FIGS. 14, 16 and 18 depict various examples of reservoir assemblies consistent with the technology disclosed herein.
Figure 15:
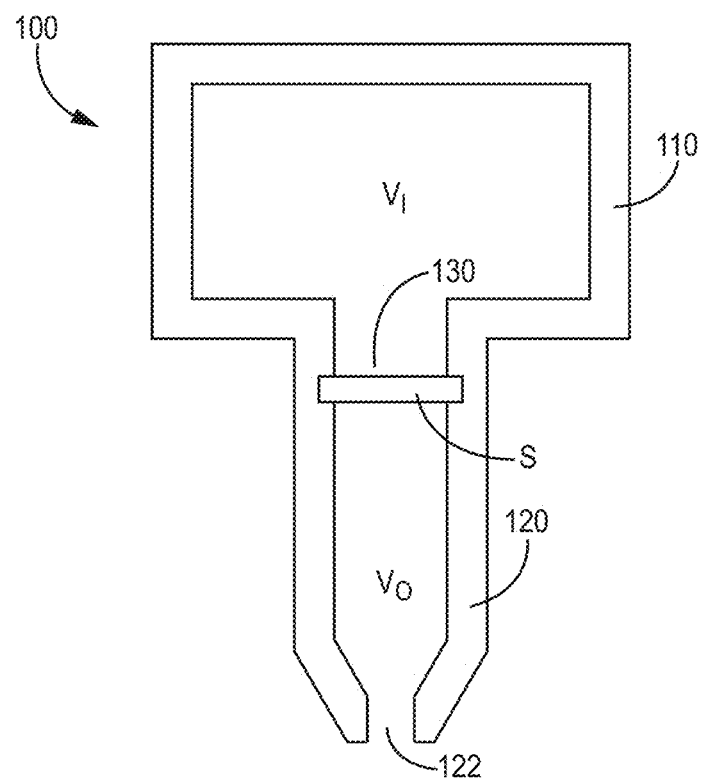
Figure 16:
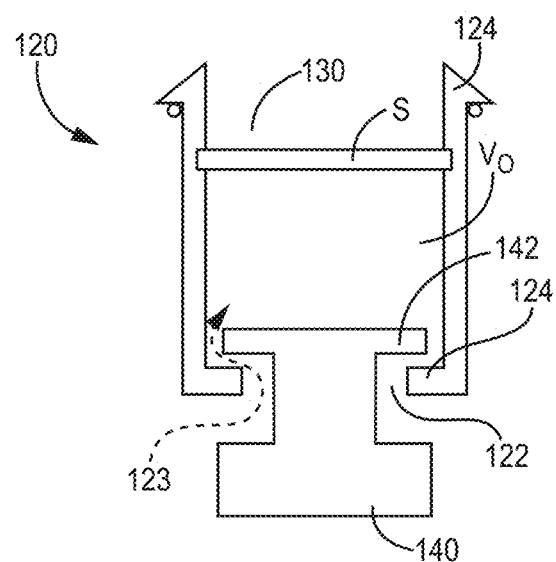
Figure 18:
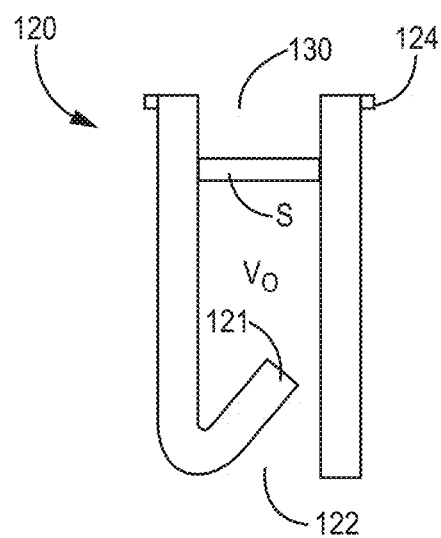

A reservoir body 120 consistent with the technology disclosed herein can form an integral, cohesive structure with the enclosure 110, such as depicted in FIGS. 3, 6, 9, 12, 13, and 15. The reservoir body 120 can also be a separate component that is coupled to the enclosure 110, such as depicted in FIGS. 1, 2, 8, 11, 14, 16 and 18, where FIGS. 14, 16, and 18 depict schematics of the reservoir body 120 uncoupled from an enclosure 110. It's noted that in the embodiments consistent with FIGS. 4, 5, 7, 10 and 17 the reservoir body 120 can be a separate component from, or integral with, the reservoir 110 to be consistent with the drawings.

Where the reservoir body 120 is a separate component from the enclosure housing 110, the reservoir body 120 can define a coupling structure 124 that is configured to be coupled to the enclosure housing 110 about the airflow pathway (which extends through the second opening 130). The coupling structure 124 can have a seal or a seal-receiving surface (such as is visible in the examples of FIGS. 1, 2, 11 and 16). In some embodiments the coupling structure 124 is a weld surface that can be welded to the enclosure housing 110. In some embodiments the coupling structure 124 is an adhesive-receiving surface to adhere the reservoir body 120 to the enclosure 110. The coupling structure 124 can be a pressure sensitive adhesive in some embodiments. In some embodiments the coupling structure 124 defines outwardly extending protrusions (such as is visible in FIGS. 14, 16 and 18) that are configured to sealingly engage mating features defined by the enclosure 110. Some examples of such coupling structures 124 can be threads, bayonet connectors, snap fit features, compression features, and the like.

Figure 8:
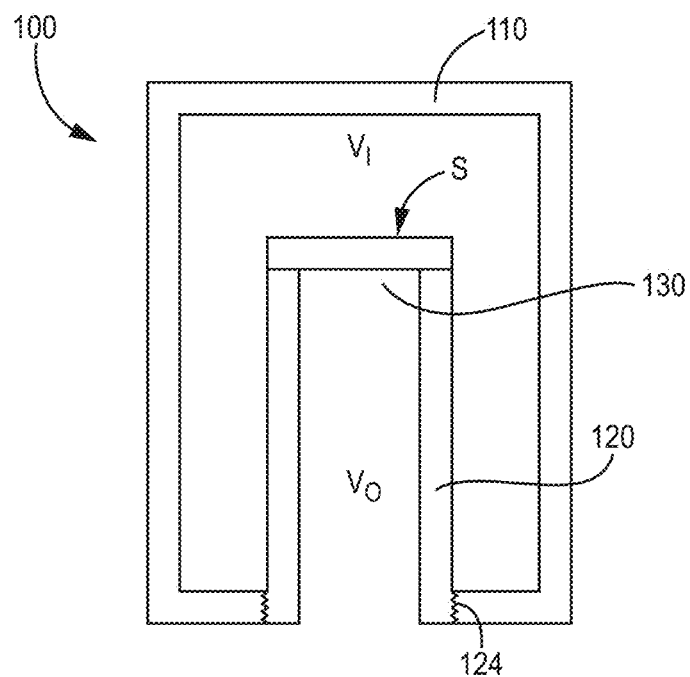
Figure 9:
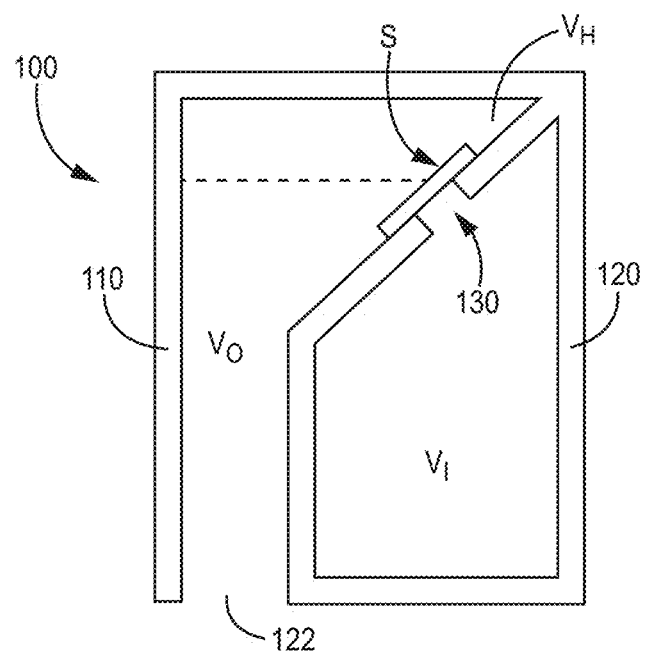

In some embodiments, such as those consistent with FIGS. 11, 14, 16 and 18, the coupling structure 124 is defined towards a top of the reservoir body 120. In some embodiments, an example of which is depicted in FIG. 8, the coupling structure 124 is defined towards a bottom of the reservoir body 120. In some embodiments, examples of which are depicted in FIGS. 1 and 2, the coupling structure 124 is defined between a top and a bottom of the reservoir body 120.

The reservoir body 120 can have a variety of configurations depending on the specific implementation. In some embodiments, such as where the reservoir body 120 may be subject to debris, the reservoir body 120 can be structured to deflect such debris. In some embodiments where the reservoir body 120 is implemented in an environment with vibrating or otherwise moving components (such as in automobiles) the reservoir body 120 can be constructed of a flexible material that can shake away debris. In some such embodiments the reservoir body 120 can flare outward about the first opening 122. In some embodiments the reservoir body 120 can be constructed of a low surface energy material so debris is less likely to stick to the reservoir body 120. In the examples in FIGS. 14 and 15 the reservoir body 120 tapers to the first opening 122. Similarly, in some embodiments, reservoir body 120 incorporates a duck bill valve that defines the first opening 122. In some embodiments, the reservoir body 120 defines perforations that define the first opening 122. In FIG. 14 the first opening 122 is oriented to be non-parallel to the water-obstructing breathable structure S, and non-parallel to a vertical axis x of the reservoir body 120. In examples consistent with such an embodiment, the first opening 122 can be oriented away from an expected source of debris. In examples consistent with the embodiment depicted in FIG. 18, the reservoir body 120 defines a flange 121 partially obstructing the first opening 122. The flange 121 extends upward.

As another example, FIG. 16 depicts a protective cap 140 disposed in the first opening 122. The protective cap 140 and the reservoir body 120 defines a liquid flow pathway 123 through the first opening 122. The reservoir body 120 defines an engagement structure 124 about the first opening 120 that is configured to loosely engage a corresponding structure 142 defined by the protective cap 140. The protective cap 140 is configured to shift or shake relative to the reservoir body 120 during normal operation, which can loosen some debris in proximity to the first opening 120.

Figure 19:
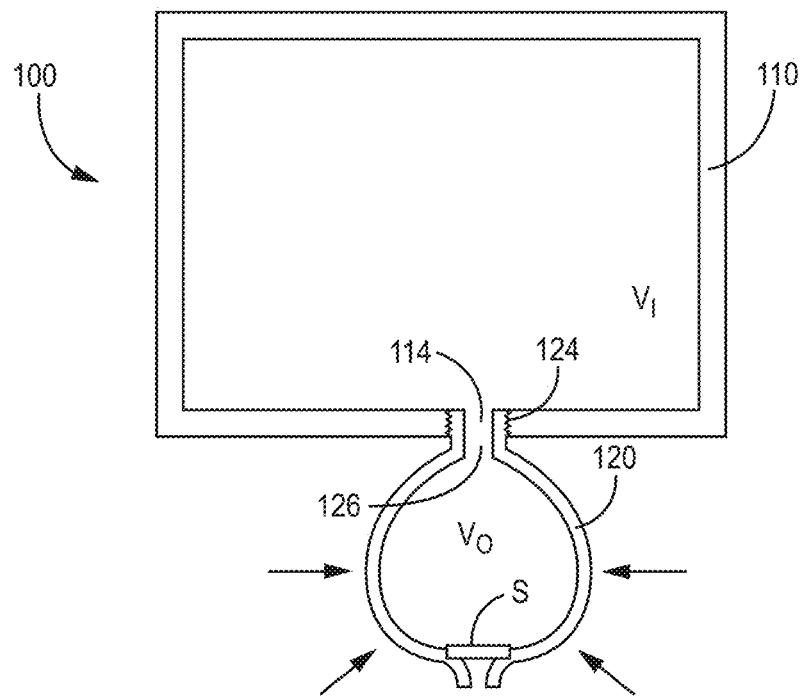
Figure 20:
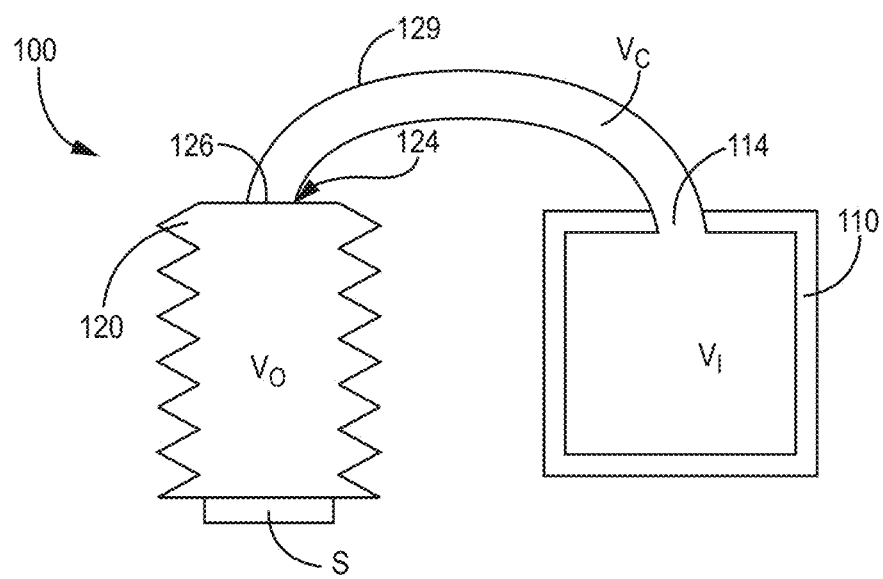
Figure 21:
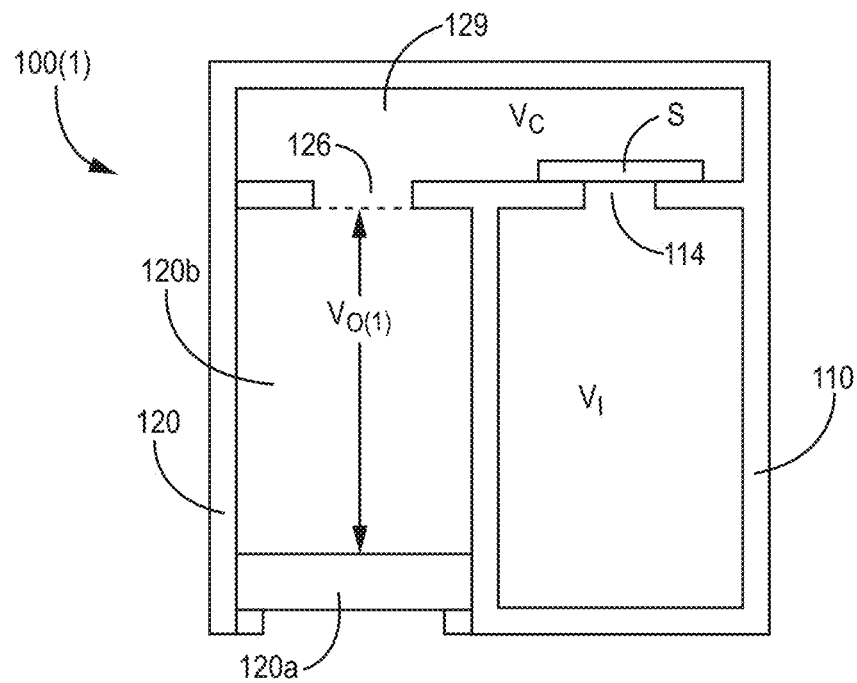

FIGS. 19-21 depict other example submergible enclosure systems 100 consistent with the technology disclosed herein. Each example enclosure system 100 has an enclosure housing 110 and reservoir body 120. The enclosure housing 110 defines an enclosure volume $V_I$ and the reservoir body 120 defines a reservoir volume $V_O$. The enclosure housing 110 defines an enclosure opening 114. The enclosure opening 114 is part of an airflow pathway between the enclosure housing 110 and the reservoir body 120.

The enclosure housing 110 is generally waterproof and has a substantially fixed enclosure volume $V_I$. The enclosure housing 110 is generally airtight except through the enclosure opening 114. The enclosure volume $V_I$ can be calculated as described above in previous discussions.

The reservoir body 120 is generally waterproof. The reservoir body 120 defines a reservoir opening 126 configured to be in airtight communication with the enclosure opening 114. The reservoir body 120 defines a variable reservoir volume $V_O$ responsive to external pressure, such as external pressure from being submerged in water. Upon being submerged in water, the pressure differential between the air within the system 100 and the surrounding water reduces the reservoir volume $V_O$, which shifts the air mass from the reservoir volume $V_O$ to the enclosure volume $V_I$. An example of this phenomenon is depicted in FIGS. 21 and 22.

Figure 22:
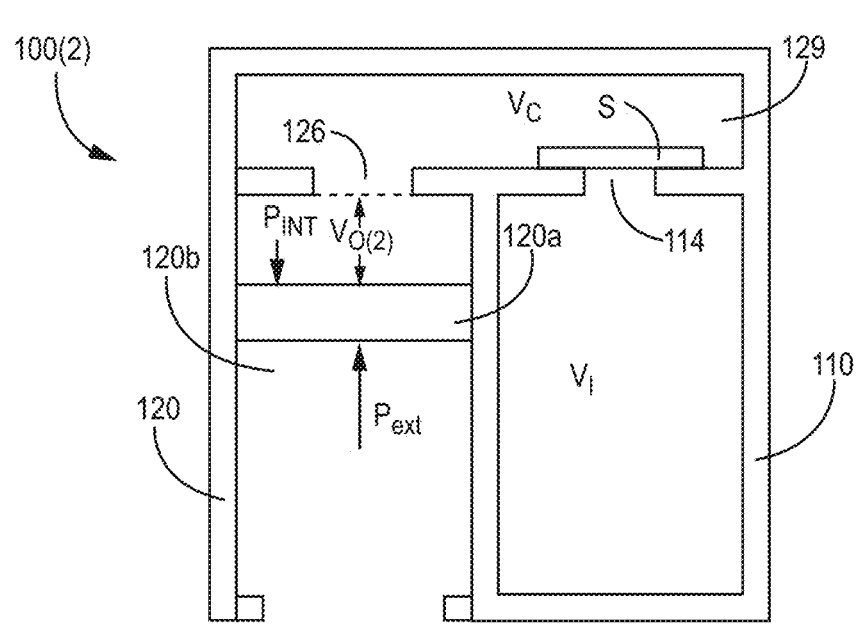

FIG. 21 depicts an example system 100(1) at atmospheric pressure, and FIG. 22 depicts the example system 100(2) submerged under water. In FIGS. 21 and 22, the reservoir body 120 defines a piston pathway 120b, and the reservoir body 120 has a piston 120a that is slidably disposed in the piston pathway 120b. At atmospheric pressure, the piston 120(a) is in a first position, where the reservoir body 120 defines a first reservoir volume $V_O(i)$ (FIG. 21). When submerged under water to a particular depth, the reservoir body 120 defines a second reservoir volume $V_{O(2)}$ (FIG. 22).

When submerged under water (FIG. 22), surrounding water pressure $P_{ext}$ pushes against the piston. When the pressure within the system $P_{int}$ is lower than the surrounding water pressure $P_{ext}$ (assuming the pressure differential is large enough to overcome the piston's resistance to translation), the piston 120a translates upward through the piston pathway 120b until the external pressure $P_{ext}$ of the surrounding water is not sufficient to translate the piston against the pressure $P_{int}$ within the system 100. In some implementations, the surrounding water pressure $P_{ext}$ can be high enough to displace the entire reservoir volume $V_O$ of air to the rest of the system 100. In such implementations, a pressure differential can remain between the system 100 and the surrounding water, but the pressure differential would be lower than systems lacking a reservoir.

It's noted that, because the piston pathway 120b is configured in a vertical orientation, when the system 100 is not submerged in water, gravity biases the piston in the first position to maximize the reservoir volume $V_{O(1)}$ (FIG. 21). In some other embodiments, the piston pathway can extend horizontally. In such embodiments, the piston can be biased with a spring or other device to maximize the reservoir volume when the system is not submerged in water.

FIGS. 19 and 20 depict additional example reservoir configurations consistent with embodiments. In FIG. 19 the reservoir body 120 is a bladder. The bladder can be constructed of various materials and combinations of materials. In some embodiments the bladder is an elastomeric material. In FIG. 20 the reservoir body 120 is a bellows. The size of the reservoir volume $V_O$ compared to the size of the fixed system volume can be consistent with the description above with reference to FIGS. 1-8, where the reservoir volume $V_O$ is the maximum reservoir volume (when the reservoir 120 is under atmospheric conditions) minus the minimum reservoir volume (when the reservoir is compressed under an expected maximum water pressure). As described above, the fixed system volume is the enclosure volume $V_I$ plus the minimum reservoir volume, plus any other fixed volumes in the system between the reservoir 120 and the enclosure 110, such as a conduit volume $V_C$ of the conduit 129 (FIGS. 20-22) extending between the enclosure 110 and the reservoir body 120.

A water-obstructing breathable structure S can be incorporated in various systems consistent with the current technology. The water-obstructing breathable structure S can be consistent with the structures and materials described above with reference to FIGS. 1-18. The reservoir body 120 can have a water-obstructing breathable structure S at least partially defining the reservoir body 120, such as in the examples depicted in FIGS. 19 and 20. In such examples, the water-obstructing breathable structure S defines a bottom surface relative to the reservoir body 120. In such embodiments, when submerged under water, the water-obstructing breathable structure S is one of the first components covered with water, which blocks the release of air from the reservoir 110. In some embodiments, the piston 120a of FIG. 21 can incorporate a water-obstructing breathable structure. Additionally or alternatively, a water-obstructing breathable structure S is disposed across the enclosure opening 114, such as depicted in the example of FIG. 21. In some embodiments, a water-obstructing breathable structure S is disposed on a bottom surface of the enclosure housing, across an opening defined therein.

In various embodiments consistent with FIGS. 19-21, the reservoir 120 is a separate component that can be added to an enclosure system. In such embodiments, the reservoir 120 can define a coupling structure 124 configured to be coupled to the enclosure housing 110 to define an airflow pathway through the reservoir opening 126. The coupling structure 124 is generally configured to form an airtight seal with the enclosure housing 110. The coupling structure 124 can be disposed about the reservoir opening 126. While FIG. 22 depicts a system where the reservoir 120 and the enclosure 110 appear to be integral, in some examples the reservoir 120 defines a coupling structure to form an airtight seal with the enclosure housing 110 about the enclosure opening 114 and/or the reservoir opening 126.

DESCRIPTION OF EXEMPLARY EMBODIMENTS

Embodiment 1

A reservoir assembly comprising:
a reservoir body defining a first opening and a reservoir volume, wherein the first opening defines a liquid communication path between the reservoir volume and an ambient environment; and
a water-obstructing breathable structure disposed across a second opening defined between the reservoir body and an electronic enclosure having an enclosure volume, wherein the reservoir volume extends in a vertical direction between the first opening and the water-obstructing breathable structure; and wherein the reservoir body is airtight above the first opening except through the second opening.

Embodiment 2

The reservoir assembly of any one of embodiments 1 and 3-17, wherein the reservoir body extends vertically above the second opening.

Embodiment 3

The reservoir assembly of any one of embodiments 1-2 and 4-17, wherein a portion of the reservoir body is oriented obliquely to the vertical direction.

Embodiment 4

The reservoir assembly of any one of embodiments 1-3 and 5-17, wherein the reservoir body tapers to the first opening.

Embodiment 5

The reservoir assembly of any one of embodiments 1-4 and 6-17, further comprising a protective cap disposed in the first opening, wherein the protective cap and the reservoir body defines a liquid flow pathway through the first opening.

Embodiment 6

The reservoir assembly of any one of embodiments 1-5 and 7-17, wherein the reservoir body defines the second opening.

Embodiment 7

The reservoir assembly of any one of embodiments 1-6 and 8-17, wherein the reservoir volume is configured to be at least 0.25 of a fixed system volume comprising the enclosure volume.

Embodiment 8

The reservoir assembly of any one of embodiments 1-7 and 9-17, wherein the reservoir volume is configured to be at least 0.5 of a fixed system volume comprising the enclosure volume.

Embodiment 9

The reservoir assembly of any one of embodiments 1-8 and 10-17, wherein the reservoir volume configured to be at least 0.75 of a fixed system volume comprising the enclosure volume.

Embodiment 10

The reservoir assembly of any one of embodiments 1-9 and 11-17, wherein the water-obstructing breathable structure comprises a membrane.

Embodiment 11

The reservoir assembly of any one of embodiments 1-10 and 12-17, wherein the water-obstructing breathable structure comprises a one-way valve.

Embodiment 12

The reservoir assembly of any one of embodiments 1-11 and 13-17, wherein the water-obstructing breathable structure comprises an electronically-actuated valve.

Embodiment 13

The reservoir assembly of any one of embodiments 1-12 and 14-17, wherein the water-obstructing breathable structure comprises a hydrophobic fabric.

Embodiment 14

The reservoir assembly of any one of embodiments 1-13 and 15-17, wherein the reservoir body further defines a coupling structure configured to be coupled to the enclosure to define an airflow pathway through the second opening.

Embodiment 15

The reservoir assembly of any one of embodiments 1-14 and 16-17, wherein the coupling structure is defined towards a top of the reservoir body.

Embodiment 16

The reservoir assembly of any one of embodiments 1-15 and 17, wherein the coupling structure is defined towards a bottom of the reservoir body.

Embodiment 17

The reservoir assembly of any one of embodiments 1-16, wherein the coupling structure is defined between a top and a bottom of the reservoir body.

Embodiment 18

A reservoir assembly comprising:
a reservoir body defining a first opening, a second opening, a coupling structure, and a reservoir volume extending in a vertical direction between the first opening and the second opening,
wherein the first opening defines a liquid communication path between the reservoir volume and an ambient environment,
wherein the coupling structure is configured to be coupled to an electronic enclosure to define an airflow pathway between the reservoir volume and an enclosure volume of the electronic enclosure through the second opening; and
a water-obstructing breathable structure disposed across the second opening.

Embodiment 19

The reservoir assembly of any one of embodiments 18 and 20-33, wherein the coupling structure is defined towards a top of the reservoir body.

Embodiment 20

The reservoir assembly of any one of embodiments 18-19 and 21-33, wherein the coupling structure is defined towards a bottom of the reservoir body.

Embodiment 21

The reservoir assembly of any one of embodiments 18-20 and 22-33, wherein the coupling structure is defined between a top and a bottom of the reservoir body.

Embodiment 22

The reservoir assembly of any one of embodiments 18-21 and 23-33, wherein the reservoir body is airtight above the first opening except through the second opening.

Embodiment 23

The reservoir assembly of any one of embodiments 18-22 and 24-33, wherein the reservoir body extends vertically above the second opening.

Embodiment 24

The reservoir assembly of any one of embodiments 18-23 and 25-33, wherein a portion of the reservoir body is oriented obliquely to the vertical direction.

Embodiment 25

The reservoir assembly of any one of embodiments 18-24 and 26-33, wherein the reservoir body tapers to the first opening.

Embodiment 26

The reservoir assembly of any one of embodiments 18-25 and 27-33, further comprising a protective cap disposed in the first opening, wherein the protective cap and the reservoir body defines a liquid flow pathway through the first opening.

Embodiment 27

The reservoir assembly of any one of embodiments 18-26 and 28-33, wherein the reservoir volume is configured to be at least 0.25 of a fixed system volume comprising the enclosure volume.

Embodiment 28

The reservoir assembly of any one of embodiments 18-27 and 29-33, wherein the reservoir volume is configured to be at least 0.50 of a fixed system volume comprising the enclosure volume.

Embodiment 29

The reservoir assembly of any one of embodiments 18-28 and 30-33, wherein the reservoir volume is configured to be at least 0.75 of a fixed system volume comprising the enclosure volume.

Embodiment 30

The reservoir assembly of any one of embodiments 18-29 and 31-33, wherein the water-obstructing breathable structure comprises a membrane.

Embodiment 31

The reservoir assembly of any one of embodiments 18-30 and 32-33, wherein the water-obstructing breathable structure comprises a one-way valve.

Embodiment 32

The reservoir assembly of any one of embodiments 18-31 and 33, wherein the water-obstructing breathable structure comprises an electronically-actuated valve.

Embodiment 33

The reservoir assembly of any one of embodiments 18-32, wherein the water-obstructing breathable structure comprises a hydrophobic fabric.

Embodiment 34

A submergible enclosure system comprising:
an enclosure housing defining an enclosure volume;
a reservoir body defining a first opening and a reservoir volume, wherein the first opening defines a liquid communication path between the reservoir volume and an ambient environment;
the enclosure system defining a second opening defining an airflow pathway between the enclosure volume and the reservoir volume, wherein the reservoir volume extends in a vertical direction between the first opening and the second opening;
a water-obstructing breathable structure disposed across the second opening, wherein the enclosure housing is waterproof.

Embodiment 35

The enclosure system of any one of embodiments 34 and 36-53, wherein the reservoir body is airtight above the first opening except through the second opening.

Embodiment 36

The enclosure system of any one of embodiments 34-35 and 37-53, wherein the reservoir body defines the second opening.

Embodiment 37

The enclosure system of any one of embodiments 34-36 and 38-53, wherein the enclosure housing defines the second opening.

Embodiment 38

The enclosure system of any one of embodiments 34-37 and 39-53, wherein the second opening is mutually defined by the enclosure volume and the reservoir body.

Embodiment 39

The enclosure system of any one of embodiments 34-38 and 40-53, wherein a portion of the reservoir body is oriented obliquely to the vertical direction.

Embodiment 40

The enclosure system of any one of embodiments 34-39 and 41-53, wherein the reservoir body tapers to the first opening.

Embodiment 41

The enclosure system of any one of embodiments 34-40 and 42-53, further comprising a protective cap disposed in the first opening, wherein the protective cap and the reservoir body defines a liquid flow pathway through the first opening.

Embodiment 42

The enclosure system of any one of embodiments 34-41 and 43-53, wherein the reservoir volume is configured to be at least 0.25 of a fixed system volume comprising the enclosure volume.

Embodiment 43

The enclosure system of any one of embodiments 34-42 and 44-53, wherein the reservoir volume is configured to be at least 0.5 of a fixed system volume comprising the enclosure volume.

Embodiment 44

The enclosure system of any one of embodiments 34-43 and 45-53, wherein the reservoir volume is configured to be at least 0.75 of a fixed system volume comprising the enclosure volume.

Embodiment 45

The enclosure system of any one of embodiments 34-44 and 46-53, wherein the reservoir body further defines a coupling structure configured to be coupled to the enclosure housing about the airflow pathway.

Embodiment 46

The enclosure system of any one of embodiments 34-45 and 47-53, wherein the coupling structure is defined towards a top of the reservoir body.

Embodiment 47

The enclosure system of any one of embodiments 34-46 and 48-53, wherein the coupling structure is defined towards a bottom of the reservoir body.

Embodiment 48

The enclosure system of any one of embodiments 34-47 and 49-53, wherein the coupling structure is defined between a top and a bottom of the reservoir body.

Embodiment 49

The enclosure system of any one of embodiments 34-48 and 50-53, wherein the reservoir body extends vertically above the second opening.

Embodiment 50

The enclosure system of any one of embodiments 34-49 and 51-53, wherein the water-obstructing breathable structure comprises a membrane.

Embodiment 51

The enclosure system of any one of embodiments 34-50 and 52-53, wherein the water-obstructing breathable structure comprises a one-way valve.

Embodiment 52

The enclosure system of any one of embodiments 34-51 and 53, wherein the water-obstructing breathable structure comprises an electronically-actuated valve.

Embodiment 53

The enclosure system of any one of embodiments 34-52, wherein the water-obstructing breathable structure comprises a hydrophobic fabric.

Embodiment 54

A submergible enclosure system comprising:
an enclosure housing having a substantially fixed enclosure volume, wherein the enclosure housing defines an enclosure opening and the enclosure housing is waterproof;
a reservoir body having a variable reservoir volume responsive to external pressure, wherein the reservoir body is waterproof, wherein the reservoir body defines a reservoir opening in airtight communication with the enclosure opening.

Embodiment 55

The system of any one of embodiments 54 and 56-68, wherein the reservoir body defines a first reservoir volume at atmospheric pressure and a smaller, a second reservoir volume when the reservoir body is submerged under water.

Embodiment 56

The system of any one of embodiments 54-55 and 57-68, wherein the reservoir body comprises bellows.

Embodiment 57

The system of any one of embodiments 54-56 and 58-68, wherein the reservoir body comprises a bladder.

Embodiment 58

The system of any one of embodiments 54-57 and 59-68, wherein the bladder is an elastomeric material.

Embodiment 59

The system of any one of embodiments 54-58 and 60-68, wherein the reservoir body comprises a piston pathway and a piston slidably disposed in the opening.

Embodiment 60

The system of any one of embodiments 54-59 and 61-68, wherein the water-obstructing breathable structure comprises a membrane.

Embodiment 61

The system of any one of embodiments 54-60 and 62-68, wherein the water-obstructing breathable structure comprises a one-way valve.

Embodiment 62

The system of any one of embodiments 54-61 and 63-68, wherein the water-obstructing breathable structure comprises an electronically-actuated valve.

Embodiment 63

The system of any one of embodiments 54-62 and 64-68, wherein the water-obstructing breathable structure comprises a hydrophobic fabric.

Embodiment 64

The system of any one of embodiments 54-63 and 65-68, wherein the reservoir volume is configured to be at least 0.25 of a fixed system volume comprising the enclosure volume.

Embodiment 65

The system of any one of embodiments 54-64 and 66-68, wherein the reservoir volume is configured to be at least 0.50 of a fixed system volume comprising the enclosure volume.

Embodiment 66

The system of any one of embodiments 54-65 and 67-68, wherein the reservoir volume is configured to be at least 0.75 of a fixed system volume comprising the enclosure volume.

Embodiment 67

The system of any one of embodiments 54-66 and 68, wherein the reservoir body comprises a water-obstructing breathable structure at least partially defining the reservoir body.

Embodiment 68

The system of any one of embodiments 54-67, wherein the reservoir body comprises a water-obstructing breathable structure at least partially defining a bottom surface of the reservoir body.

Embodiment 69

A reservoir comprising:
a reservoir body defining a reservoir opening and a variable reservoir volume responsive to external pressure, wherein the reservoir body is waterproof except through the reservoir opening, and the reservoir body comprises a water-obstructing breathable structure at least partially defining the bottom of the reservoir body; and
a coupling structure configured to be coupled to an enclosure housing to define an airflow pathway through the reservoir opening.

Embodiment 70

The reservoir of any one of embodiments 69 and 71-80, wherein the reservoir body comprises bellows.

Embodiment 71

The reservoir of any one of embodiments 69-70 and 72-80, wherein the reservoir body comprises a bladder.

Embodiment 72

The reservoir of any one of embodiments 69-71 and 73-80, wherein the bladder is an elastomeric material.

Embodiment 73

The reservoir of any one of embodiments 69-72 and 74-80, wherein the reservoir body comprises a vertically-extending opening and a piston slidably disposed in the opening.

Embodiment 74

The reservoir of any one of embodiments 69-73 and 75-80, wherein the water-obstructing breathable structure comprises a membrane.

Embodiment 75

The reservoir of any one of embodiments 69-74 and 76-80, wherein the water-obstructing breathable structure comprises a one-way valve.

Embodiment 76

The reservoir of any one of embodiments 69-75 and 77-80, wherein the water-obstructing breathable structure comprises an electronically-actuated valve.

Embodiment 77

The reservoir of any one of embodiments 69-76 and 78-80, wherein the water-obstructing breathable structure comprises a hydrophobic fabric.

Embodiment 78

The reservoir of any one of embodiments 69-77 and 79-80, wherein the reservoir volume is configured to be at least 0.25 of a fixed system volume comprising the enclosure volume.

Embodiment 79

The reservoir of any one of embodiments 69-78 and 80, wherein the reservoir volume is configured to be at least 0.50 of a fixed system volume comprising the enclosure volume.

Embodiment 80

The reservoir of any one of embodiments 69-79, wherein the reservoir volume is configured to be at least 0.75 of a fixed system volume comprising the enclosure volume.

It should also be noted that, as used in this specification and the appended claims, the phrase "configured" describes a system, apparatus, or other structure that is constructed to perform a particular task or adopt a particular configuration. The word "configured" can be used interchangeably with similar words such as "arranged", "constructed", "manufactured", and the like.

All publications and patent applications in this specification are indicative of the level of ordinary skill in the art to which this technology pertains. All publications and patent applications are herein incorporated by reference to the same extent as if each individual publication or patent application was specifically and individually indicated by reference. In the event that any inconsistency exists between the disclosure of the present application and the disclosure(s) of any document incorporated herein by reference, the disclosure of the present application shall govern.

This application is intended to cover adaptations or variations of the present subject matter. It is to be understood that the above description is intended to be illustrative, and not restrictive, and the claims are not limited to the illustrative embodiments as set forth herein.

What is claimed is:

1. A reservoir assembly comprising:
   a reservoir body defining a first opening and a reservoir volume, wherein the first opening defines a liquid communication path between the reservoir volume and an ambient environment; and
   a water-obstructing breathable structure disposed across a second opening defined between the reservoir body and an electronic enclosure having an enclosure volume, wherein the reservoir volume extends in a vertical direction between the first opening and the water-obstructing breathable structure; and wherein the reservoir body is airtight above the first opening except through the second opening.

2. The reservoir assembly of claim 1, wherein the reservoir body extends vertically above the second opening.

3. The reservoir assembly of claim 1, wherein a portion of the reservoir body is oriented obliquely to the vertical direction.

4. The reservoir assembly of claim 1, further comprising a protective cap disposed in the first opening, wherein the protective cap and the reservoir body define a liquid flow pathway through the first opening.

5. The reservoir assembly of claim 1, wherein the reservoir body defines the second opening.

6. The reservoir assembly of claim 1, wherein the reservoir volume is configured to be at least 0.75 of a fixed system volume comprising the enclosure volume.

7. The reservoir assembly of claim 1, wherein the water-obstructing breathable structure comprises a membrane.

8. The reservoir assembly of claim 1, wherein the water-obstructing breathable structure comprises a one-way valve.

9. The reservoir assembly of claim 1, wherein the water-obstructing breathable structure comprises a hydrophobic fabric.

10. The reservoir assembly of claim 1, wherein the reservoir body further defines a coupling structure configured to be coupled to the enclosure to define an airflow pathway through the second opening.

11. A submergible enclosure system comprising:
    an enclosure housing defining an enclosure volume;
    a reservoir body defining a first opening and a reservoir volume, wherein the first opening defines a liquid communication path between the reservoir volume and an ambient environment;
    the enclosure system defining a second opening defining an airflow pathway between the enclosure volume and the reservoir volume, wherein the reservoir volume extends in a vertical direction between the first opening and the second opening;
    a water-obstructing breathable structure disposed across the second opening, wherein the enclosure housing is waterproof.

12. The enclosure system of claim 11, wherein the reservoir body is airtight above the first opening, except through the second opening.

13. The enclosure system of claim 11, wherein the reservoir body defines the second opening.

14. The enclosure system of claim 11, wherein the enclosure housing defines the second opening.

15. The enclosure system of claim 11, wherein the second opening is mutually defined by the enclosure volume and the reservoir body.

16. The enclosure system of claim 11, wherein the reservoir body tapers to the first opening.

17. The enclosure system of claim 11, further comprising a protective cap disposed in the first opening, wherein the protective cap and the reservoir body define a liquid flow pathway through the first opening.

18. The enclosure system of claim 11, wherein the reservoir volume is configured to be at least 0.25 of a fixed system volume comprising the enclosure volume.

19. The enclosure system of claim 11, wherein the reservoir body further defines a coupling structure configured to be coupled to the enclosure housing about the airflow pathway.

20. The enclosure system of claim 11, wherein the reservoir body extends vertically above the second opening.

* * * * *